(12) United States Patent
Wasserman

(10) Patent No.: US 10,794,618 B2
(45) Date of Patent: Oct. 6, 2020

(54) THERMOELECTRIC COOLING TANK SYSTEM AND METHODS

(71) Applicant: LVD ACQUISITION, LLC, Columbus, OH (US)

(72) Inventor: Alexander Wasserman, West Hills, CA (US)

(73) Assignee: LVD Acquisition, LLC, Columbus, OH (US)

( * ) Notice: Subject to any disclaimer, the term of this patent is extended or adjusted under 35 U.S.C. 154(b) by 220 days.

(21) Appl. No.: 15/771,928

(22) PCT Filed: Oct. 31, 2016

(86) PCT No.: PCT/US2016/059707
§ 371 (c)(1),
(2) Date: Aug. 2, 2018

(87) PCT Pub. No.: WO2017/075584
PCT Pub. Date: May 4, 2017

(65) Prior Publication Data
US 2018/0306471 A1 Oct. 25, 2018

Related U.S. Application Data

(60) Provisional application No. 62/248,626, filed on Oct. 30, 2015.

(51) Int. Cl.
| F25B 21/02 | (2006.01) |
| F25B 49/00 | (2006.01) |
| H01L 35/30 | (2006.01) |
| B67D 1/08  | (2006.01) |
| B67D 3/00  | (2006.01) |
| F25D 31/00 | (2006.01) |
| H01L 35/32 | (2006.01) |

(52) U.S. Cl.
CPC ............ *F25B 21/02* (2013.01); *B67D 1/0869* (2013.01); *B67D 3/0009* (2013.01); *F25B 49/00* (2013.01); *F25D 31/002* (2013.01); *H01L 35/30* (2013.01); *H01L 35/32* (2013.01); *F25B 2321/023* (2013.01)

(58) Field of Classification Search
CPC .............. F25B 21/02; F25B 2321/0252; F25B 2321/023; F25D 31/002
See application file for complete search history.

(56) References Cited

U.S. PATENT DOCUMENTS 3,008,299 A * 11/1961 Sheckler ................. F25B 21/02
                                                          62/3.64
3,073,127 A *  1/1963 Schmerzler ............. F25B 21/02
                                                          62/3.6

(Continued)

FOREIGN PATENT DOCUMENTS

| KR | 20150002991 A | 1/2015 |
| WO | 2012091499 A2 | 7/2012 |

*Primary Examiner* — Nelson J Nieves
(74) *Attorney, Agent, or Firm* — Standley Law Group LLP; Stephen L. Grant; Jeffrey S. Standley

(57) ABSTRACT

Exemplary embodiments include tanks for cooling liquid where at least two thermoelectric chips come into contact with and cool a plurality of conductive fins that each extend into the interior of the tank where they come into contact with and thereby chill fluid as it is housed in and flows between two connected chambers within the tank.

19 Claims, 11 Drawing Sheets

(56) References Cited

U.S. PATENT DOCUMENTS

| | | | |
|---|---|---|---|
| 4,055,053 A | 10/1977 | Elfving et al. | |
| 4,711,294 A * | 12/1987 | Jacobs | F24F 3/153 |
| | | | 165/230 |
| 5,367,879 A * | 11/1994 | Doke | F25B 21/02 |
| | | | 62/139 |
| 5,501,077 A | 3/1996 | Davis et al. | |
| 5,609,033 A * | 3/1997 | Dong | B67D 3/0009 |
| | | | 62/3.64 |
| 5,862,669 A * | 1/1999 | Davis | B67D 3/0009 |
| | | | 62/208 |
| 5,987,892 A | 11/1999 | Watanabe et al. | |
| 6,003,318 A | 12/1999 | Busick et al. | |
| 6,508,070 B1 * | 1/2003 | Palmer | B67D 1/0857 |
| | | | 62/201 |
| 6,532,749 B2 * | 3/2003 | Rudick | F25B 9/14 |
| | | | 62/239 |
| 6,895,762 B1 | 5/2005 | Lin | |
| 7,237,390 B1 * | 7/2007 | Nelson | B67D 1/0859 |
| | | | 62/3.64 |
| 8,904,808 B2 * | 12/2014 | Ghoshal | F25B 21/02 |
| | | | 62/3.2 |
| 9,377,223 B1 * | 6/2016 | Walker | F25B 21/04 |
| 9,717,114 B1 * | 7/2017 | Walker | H05B 1/0297 |
| 2002/0162339 A1 * | 11/2002 | Harrison | B67D 1/0869 |
| | | | 62/3.7 |
| 2006/0000221 A1 * | 1/2006 | Culp | F25B 21/02 |
| | | | 62/3.6 |
| 2007/0107441 A1 * | 5/2007 | Lee | F25B 21/02 |
| | | | 62/3.7 |
| 2008/0184710 A1 | 8/2008 | DeVilbiss | |
| 2011/0016886 A1 * | 1/2011 | Ghoshal | F25B 21/02 |
| | | | 62/3.2 |
| 2014/0318152 A1 * | 10/2014 | Ghoshal | F25B 21/02 |
| | | | 62/3.2 |
| 2015/0128614 A1 * | 5/2015 | Ghoshal | F25B 21/00 |
| | | | 62/3.3 |
| 2016/0243000 A1 * | 8/2016 | Gray | F25B 21/02 |
| 2017/0354190 A1 * | 12/2017 | Cauchy | A47C 7/744 |
| 2018/0252446 A1 * | 9/2018 | Place | F25D 31/002 |
| 2019/0285355 A1 * | 9/2019 | Lee | F28D 15/0275 |

* cited by examiner

THERMOELECTRIC COOLING TANK SYSTEM AND METHODS

CROSS-REFERENCE TO RELATED APPLICATIONS

This application is a non-provisional patent application filed under provisions of the Patent Cooperation Treaty and makes a priority claim to U.S. provisional application 62/248,626, filed on Oct. 30, 2015, which is incorporated herein by reference as if fully recited herein.

TECHNICAL FIELD

Exemplary embodiments relate to devices and methods for cooling liquids, such as water for example, using a tank comprising a unique combination of cooling fins and a baffle that work in conjunction with a first and a second thermoelectric chip. A preferred exemplary embodiment comprises a cooling tank that receives and selectively maintains a volume of water from a water inlet and that provides chilled water to a water outlet, a baffle having a first side and a second side and that is disposed within the tank such that water within the tank is received from the inlet into a first area of the tank that is largely defined by the first side of the baffle and water is removed from the tank by the water outlet from a second area of the tank that is largely defined by the second side of the baffle, a plurality of cooling fins that extend from the first side of the baffle to the second side of the baffle, and dual thermoelectric chips in connectivity with the cooling fins such that heat may be drawn from the fins by the thermoelectric chips causing the volume of water within the tank—on both sides of the baffle—to be chilled.

BACKGROUND OF THE ART

Thermoelectric cooling uses the Peltier effect to create a heat flux between the junction of two different types of materials. A thermoelectric cooler is a solid-state active heat pump which transfers heat from one side of the device to the other with consumption of electrical energy, depending on the direction of the current. Thermoelectric water coolers are well known and have been on the market for more than 20 years. The advantages to thermoelectric water coolers are durability, their lightweight, and compact size as compared to more traditional compressor-driven cooling systems. The disadvantages to previously known thermoelectric water coolers are that they are not as energy efficient as compression-driven cooling systems and they are relatively slow in chilling water. There is a need in the art for improved thermoelectric cooling systems and methods that cool water (and other liquids) in an energy efficient manner and which meet the energy star guidelines of the Environmental Protection Agency ("EPA").

SUMMARY OF THE INVENTION

The devices and methods of the present invention provide an energy efficient thermoelectric cooler that solves the problems inherent in the known thermoelectric cooling systems. In a preferred exemplary embodiment, a cooling tank is connected to a water inlet and a water outlet. A baffle is disposed within the tank such that it creates a first area for receiving water from the inlet and a second area for providing chilled water to the outlet. The baffle does not completely divide the tank but instead permits for water to flow from the first area to the second area within the tank preferably at an opening (or more than one opening in some embodiments) which exists at and is defined by the top of the interior of the tank and the top of the baffle.

At least one, but preferably a plurality of, cooling fin(s) is also disposed within the tank such that they extend through the baffle and are at least partially exposed to water in both the first area and the second area. The cooling fins may be in connectivity with at least one thermoelectric chip, but preferably dual thermoelectric chips, that effectuate the cooling of the fins. The thermoelectric chips are ideally positioned outside of the tank. In a preferred embodiment, the cooling fins are positioned at an upper part of the baffle near the opening(s) where water may flow from the first area to the second area. Preferably, as water is received by the tank at the inlet, the water flows into the first area and cooling of the water may commence due to exposure of at least some of the water in the first area to the cooling fins. As water is drawn from the tank via the outlet, water may flow from the first area to the second area through the opening(s). When the cooling fins are disposed at an upper portion of the baffle/tank near the opening(s), the flowing water may be exposed to the cooling fins in the first area and then also in the second area after the water passes through the opening causing relatively quick chilling of the water. In a preferred embodiment, the cooling fins are actually received by the openings which permit for water to travel from the first area to the second area. Such an embodiment permits for flowing water to be chilled as it travels between the first and second areas of the tank.

The thermoelectric chips that provide the cooling to the cooling fins preferably each have a first and second side. The first side is cool and is the side which is in connectivity (either direct or indirect) with the cooling fins. The second side of the thermoelectric chips is hot and is ideally in connectivity with a heat sink. A fan is preferably positioned next to the heat sink such that it can draw air through and cool the heat sink, preventing the heat sink from overheating. There may be Insulation surrounding the tank that separates the tank from the warm side of the thermoelectric chips, the heat sink, and the fan. A benefit of exemplary embodiments of the present invention is that most of the chilled water within the tank can be removed from the tank (via the outlet) with less warming effect of incoming water (from the inlet) resulting in more chilled water volume within the tank that is available for drinking.

This exemplary thermoelectric cooling system may additionally comprise a first and a second power supply. In exemplary embodiments comprising a first and second power supply, the first power supply preferably provides a high energy output to the fan and thermoelectric chip(s) when more cooling is needed such as for example when there is a need to cool incoming water that has been received from the inlet such that the water within the tank is chilled to a desired set point. The second power supply preferably provides a low power output to the fan and thermoelectric chips and can be utilized when less cooling is needed such as, for example, when water that has been in the tank for some time needs periodic cooling to maintain the water at the desired chilled set point. Utilization of dual power supplies increases the efficiency of the exemplary thermoelectric cooling device and assists the device in meeting energy star guidelines.

BRIEF DESCRIPTION OF THE DRAWINGS

Novel features and advantages of the present invention, in addition to those mentioned above, will become apparent to those skilled in the art from a reading of the following detailed description in conjunction with the accompanying drawings wherein identical characters refer to identical parts and in which.

DETAILED DESCRIPTION OF EXEMPLARY EMBODIMENTS

Figure 1:
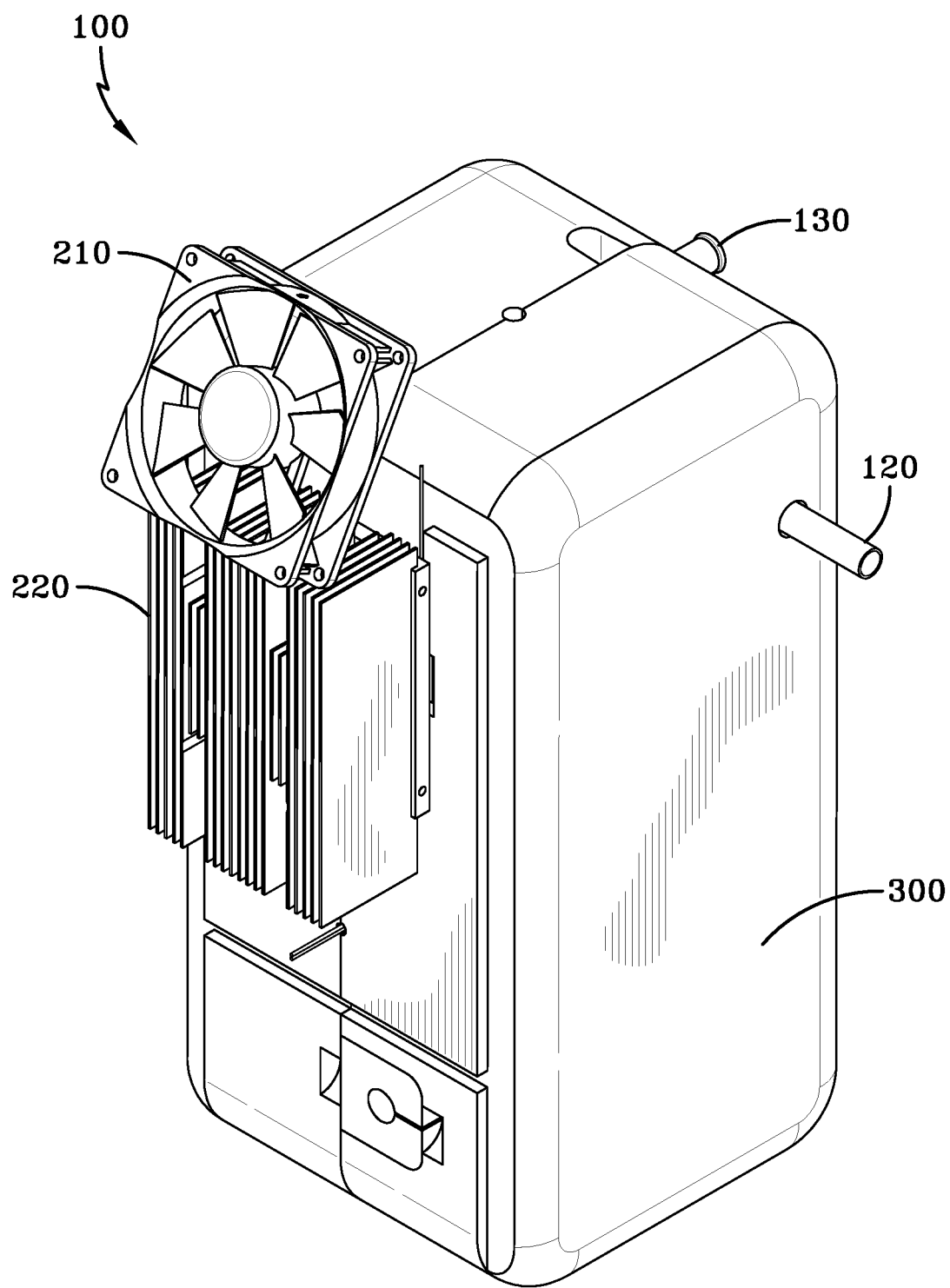
FIG. 1 is a rear perspective view of an exemplary cooling device wherein at least part of the device is shown covered in insulation.
Figure 2:
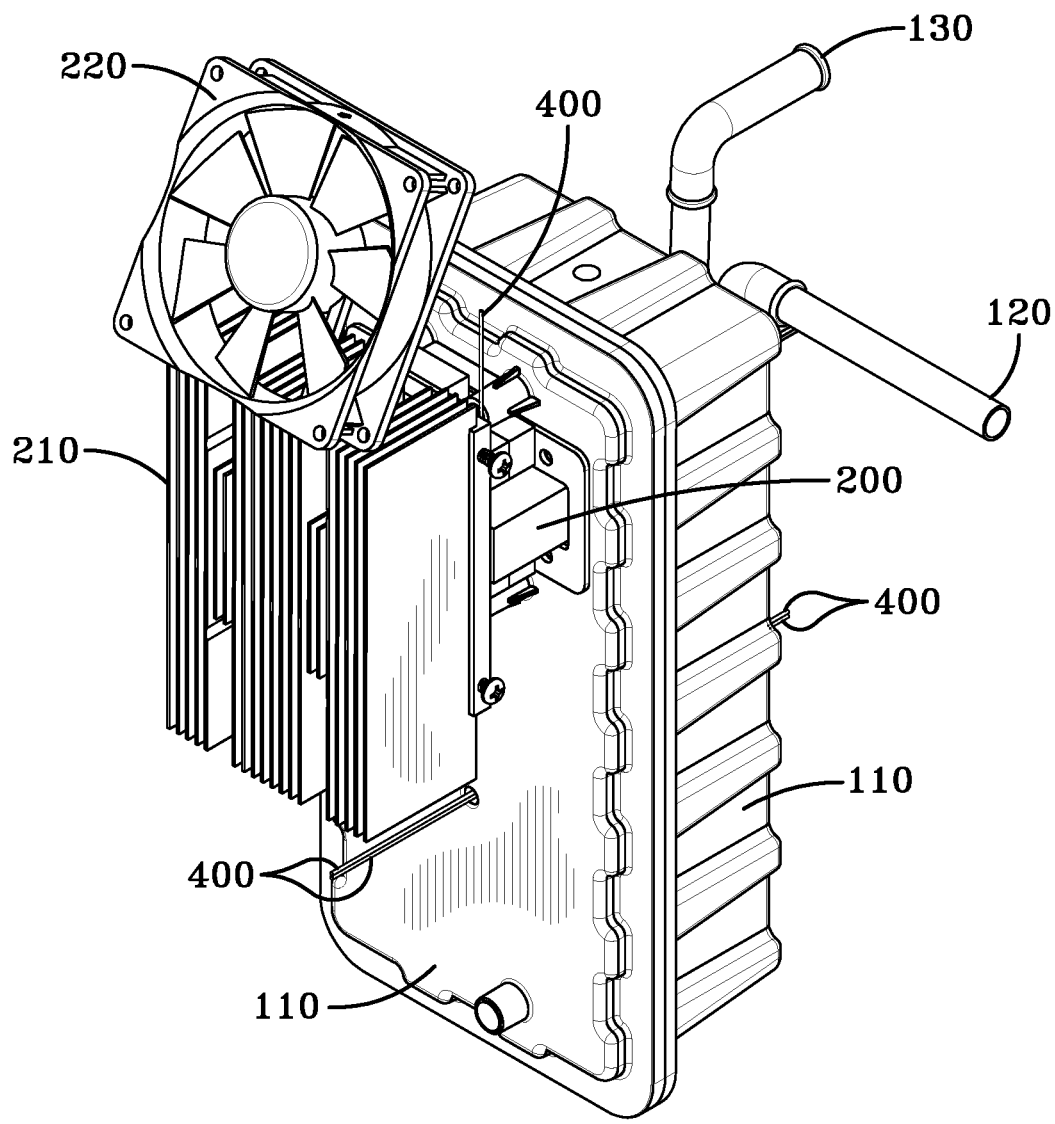
FIG. 2 is a right side perspective view of the exemplary cooling device of FIG. 1 shown without the insulation.

A preferred exemplary embodiment of a cooling device 100 is shown in FIG. 1. The exemplary system 100 preferably comprises a tank 110 that is connected to a water inlet 120 and a water outlet 130. The tank 110 may be fabricated from polyethylene or polypropylene in some exemplary embodiments. As can be seen in FIG. 2, the tank 110 may be formed using more than one piece. In some embodiments, and as shown in FIG. 2, the inlet 120 and outlet 130 are tube-like structures which permit for the travel of liquid to and from the tank 110. However, it should be understood that in some embodiments, the inlet 120 and outlet 130 consist of and/or comprise openings defined at least in part by the tank 110 and which permit for liquid to flow into and out of the tank. Those inlet/outlet openings 120 and 130 might then be connected to tubing or some other structure which would affix the tank 110 to and integrate the tank 110 into a water source such as a water cooler or water fountain. FIG. 2 illustrates the exemplary cooling device of FIG. 1 shown without the insulation layer 300 so that the tank 110 can more clearly be seen.

Figure 3:
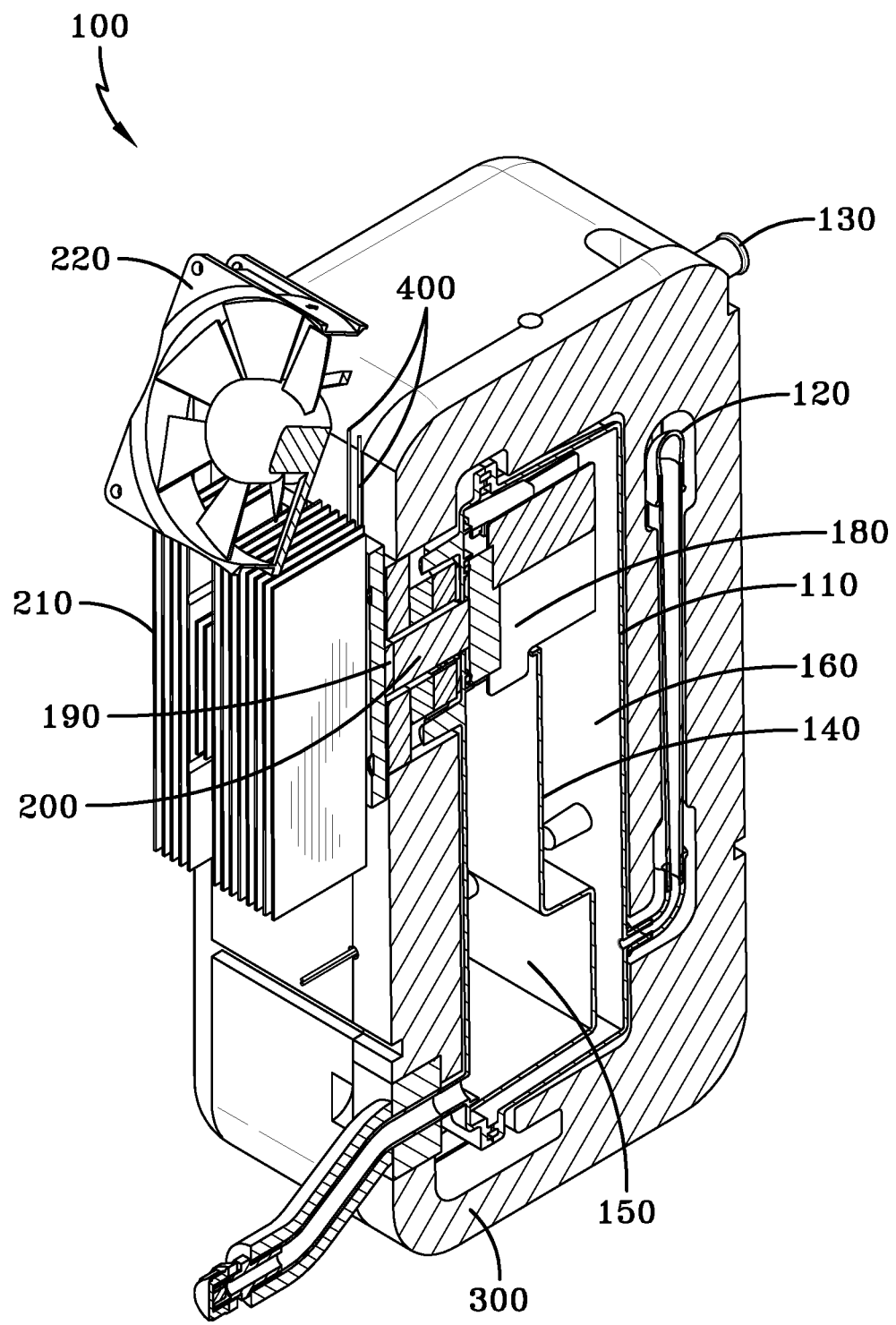
FIG. 3 is a cross-sectioned view of the exemplary device shown in FIG. 1.

As can be seen in FIG. 3, A baffle 140 is preferably disposed within the tank 110 such that the baffle 140 defines (preferably in conjunction with the interior of the tank 110 or some other surface) a first area 150 for receiving water from the inlet 120 and a second area 160 for providing chilled water to the outlet 130. The baffle 140 does not completely divide the tank 110 such that the first area 150 and the second area 160 are completely separated but instead, the baffle 140 permits for water to flow from the first area 150 to the second area 160 within the tank 110 preferably via at least one opening 170 which exists at and may be defined by the top of the interior of the tank 110 and the top of the baffle 140. The baffle 140 may be fabricated from polyethylene or polypropylene in some exemplary embodiments.

Figure 5:
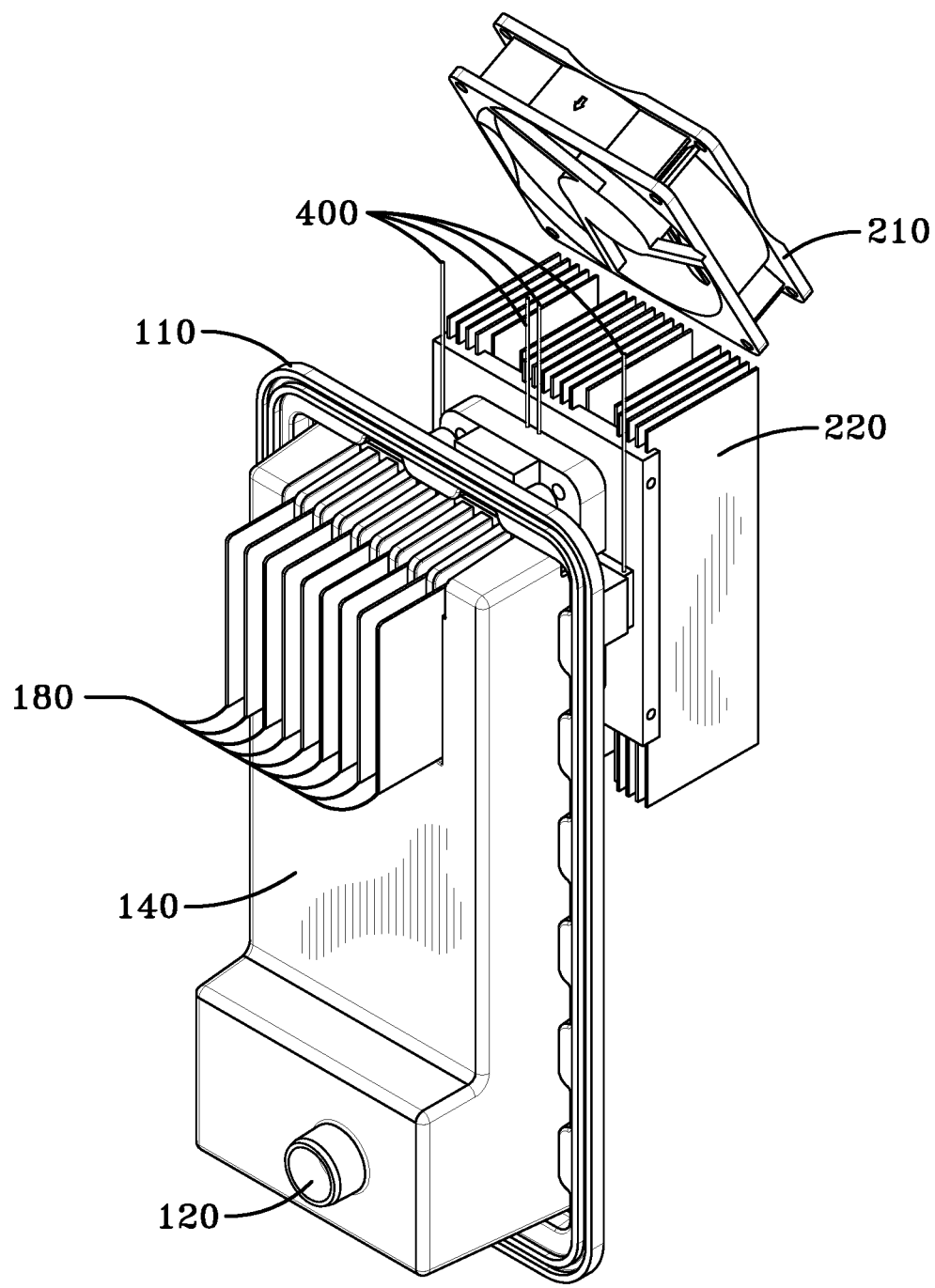
FIG. 5 shows a front perspective view of the exemplary device of FIG. 1 wherein the tank and insulation have not been shown in order to illustrate a preferred baffle and cooling fin configuration.

As can be seen in FIG. 5, at least one, and ideally a plurality of cooling fins 180 is also disposed within the tank 110 such that the fins 180 extend through the baffle 140 and are at least partially exposed to water in both the first area 150 and the second area 160. In some embodiments, the cooling fins 180 may be made from anodized aluminum in some exemplary embodiments. Note that in FIG. 5, part of the exterior of tank 110 has not been shown in order to more clearly show the configuration of the baffle 140 in relationship with the cooling fins 180. Each one of the cooling fins 180 has a surface area which can be exposed to water in the tank 110. In preferred embodiments, such as that shown in FIG. 5, at least one opening 170, exists about and is defined by at least one of the cold fins 180 and the baffle 140 such that in traveling from area 150 to area 160 the water is exposed to a substantial surface area of the cooling fins 180. The plurality of cooling fins 180 is preferably held within their desired location within the tank 110 by attachment to the interior wall of the tank 110. As more easily seen in FIGS. 11 and 12, the cooling fins 180 may be part of and/or connected to the wall of the tank 110 via a relatively flat plate 181 that extends through the wall of the tank 110. In some exemplary embodiments, the plate 181 and fins 180 are extruded/formed as a single piece. In other exemplary embodiments, the fins 180 are individual pieces of material (such as aluminum) that are received by form-fitting grooves defined by the plate 181 and then the sides of the grooves of the plate 181 are crimped in tightly onto the fins 180 holding them in place. As shown in FIG. 3, the cooling fins 180 may be in thermal connectivity (directly or indirectly) with dual thermoelectric chips 190 that effectuate the cooling of the fins 180 and thus the cooling of water in the tank 110.

Figure 11:
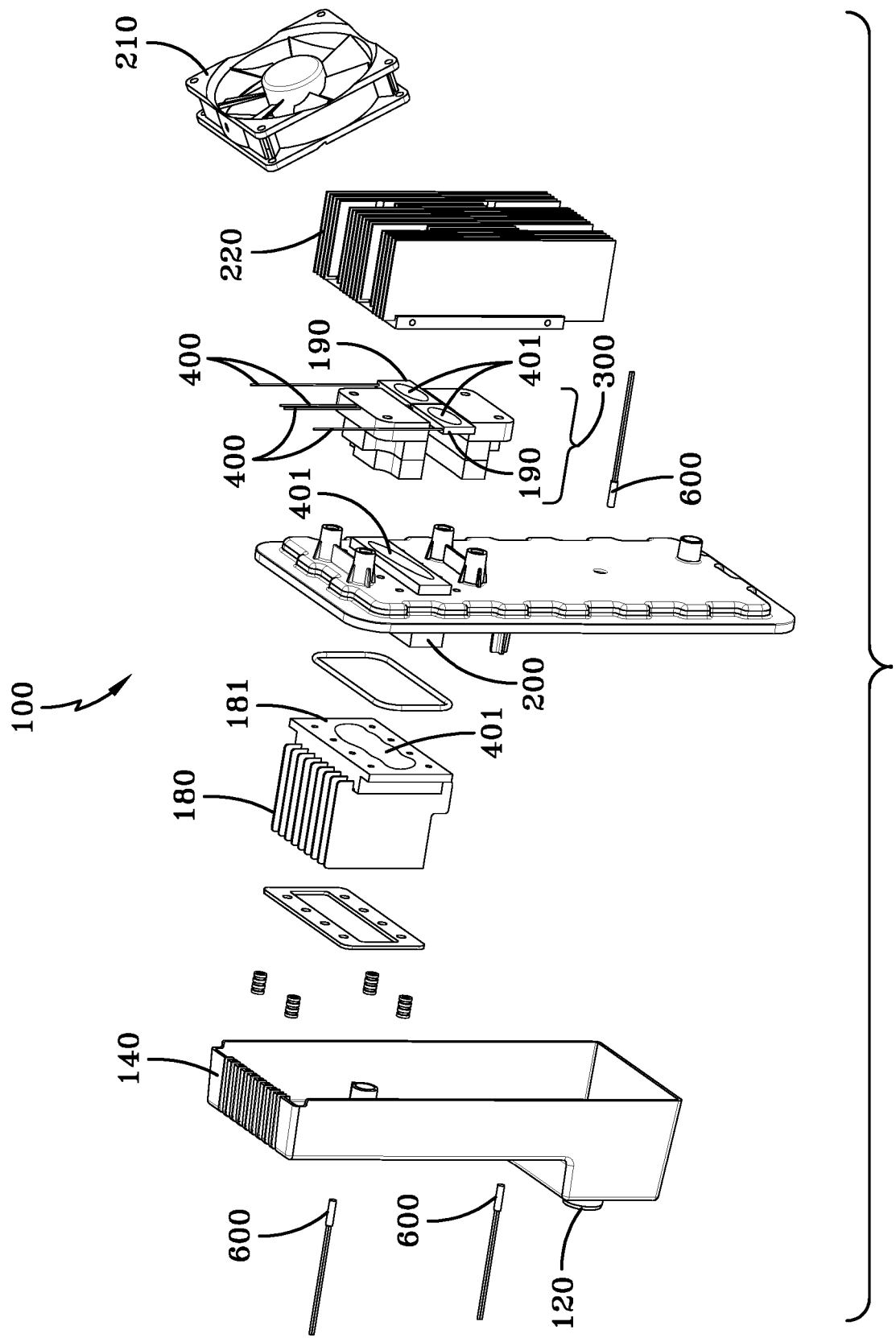
FIG. 11 is an exploded view of the exemplary cooling device shown in FIGS. 1, 2, 3, 4, 5, 6, and 7 wherein part of the tank is not shown in order to more clearly show the other components of the device.

In one exemplary embodiment, the thermoelectric chips 190 are placed in thermal contact/connectivity with the cooling fins 180 by applying a thin layer of heat sink material 401 (for example, a heat sink paste) between the chips 190 and the spacer block 200 and then applying a force to hold the components together. Preferably, the heat sink material 401 (preferably a compound or thermal paste) is applied between the heat sink 210 and the thermoelectric chips 190 as well as between the chips 190 and the spacer block 200 as well as between the spacer block 200 and the cooling fins 180 and/or the cooling fin plate 181. This preferred exemplary embodiment is shown in FIG. 11. The force that holds the assembly together may be generated by one or more screws connected to the tank 110. In another exemplary embodiment, the thermoelectric chips 190 are placed in thermal contact/connectivity with the cooling fins 180 by bonding the chips 190 to the cooling fins 180 and/or the cooling fin plate 181 using a thermal epoxy. This alone is capable of holding these parts together and providing heat conduction between the chips 190 and the cooling fins 180.

Figure 4:
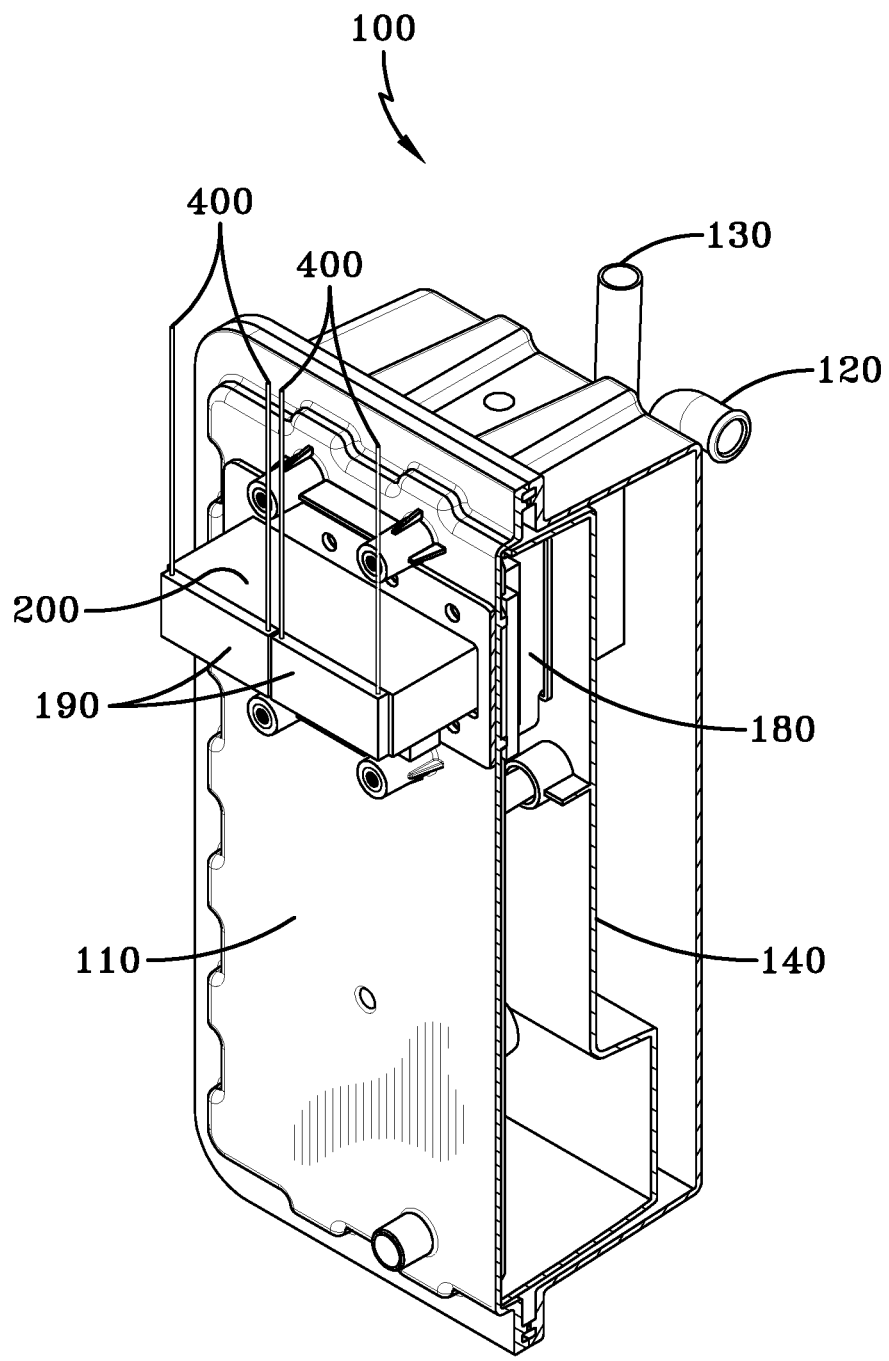
FIG. 4 is a cross-sectioned view of the exemplary tank shown in FIG. 1 shown without insulation wherein the heat sink and fan are not shown in order to more clearly show a preferred configuration of the thermoelectric chips.

FIG. 4 more clearly shows how twin thermoelectric chips 190 may be incorporated into the exemplary device 100. In such a configuration, the twin thermoelectric chips 190 spread their cooling effect over a wider area within the tank 110 than would be possible via a single chip or two chips disposed in a different configuration. So, rather than having a very cold spot in the center of a single, larger thermoelectric chip, the heat load can be absorbed more evenly and efficiently by the two chips 190. Similarly, heat can be more evenly and efficiently dissipated from the opposite side of the dual, twin chips. Ideally, the twin thermoelectric chips 190 are positioned such that the heat load is spread over a larger width that is perpendicular to the flow of water within the tank 110. Such a configuration is shown in FIG. 3. In alternate embodiments, the thermoelectric chips 190 may be positioned such that the heat load is spread over a larger area that is vertical to the flow of water within the tank 110. However, when such a configuration is utilized, there would be more warm water passing by the width of the thermoelectric chips 190 and the water that contacted the thermoelectric chips 190 would cool as it entered the cooling fins 180 and be cooled sufficiently at the midpoint of the thermoelectric chips 190. As the water continues vertically, the heat exchange would decrease. More heat exchange happens when the water and cooling fins 180 are at a greater temperature difference. Also, the water is cold enough when it reached the midpoint. Cooling it further is not necessary. Thus, such alternate configurations, while possible, do not maximize efficiency. In exemplary embodiments comprising dual thermoelectric chips 190, the two thermoelectric chips 190 are preferably "twin" (i.e. substantially identical to each other) as has been discussed above. But, some exemplary embodiments may use dual thermoelectric chips 190 where the first and second chips are not substantially identical to each other. For example, a first chip may be larger than the second chip. In some exemplary embodiments, there may be three of more thermoelectric chips (they may be arranged similarly to the description regarding dual chip layouts provided herein) which may further increase the cooling performance. Some exemplary embodiments may comprise a single thermoelectric chip, but these embodiments are not preferred for the aforementioned reasons.

Figure 6:
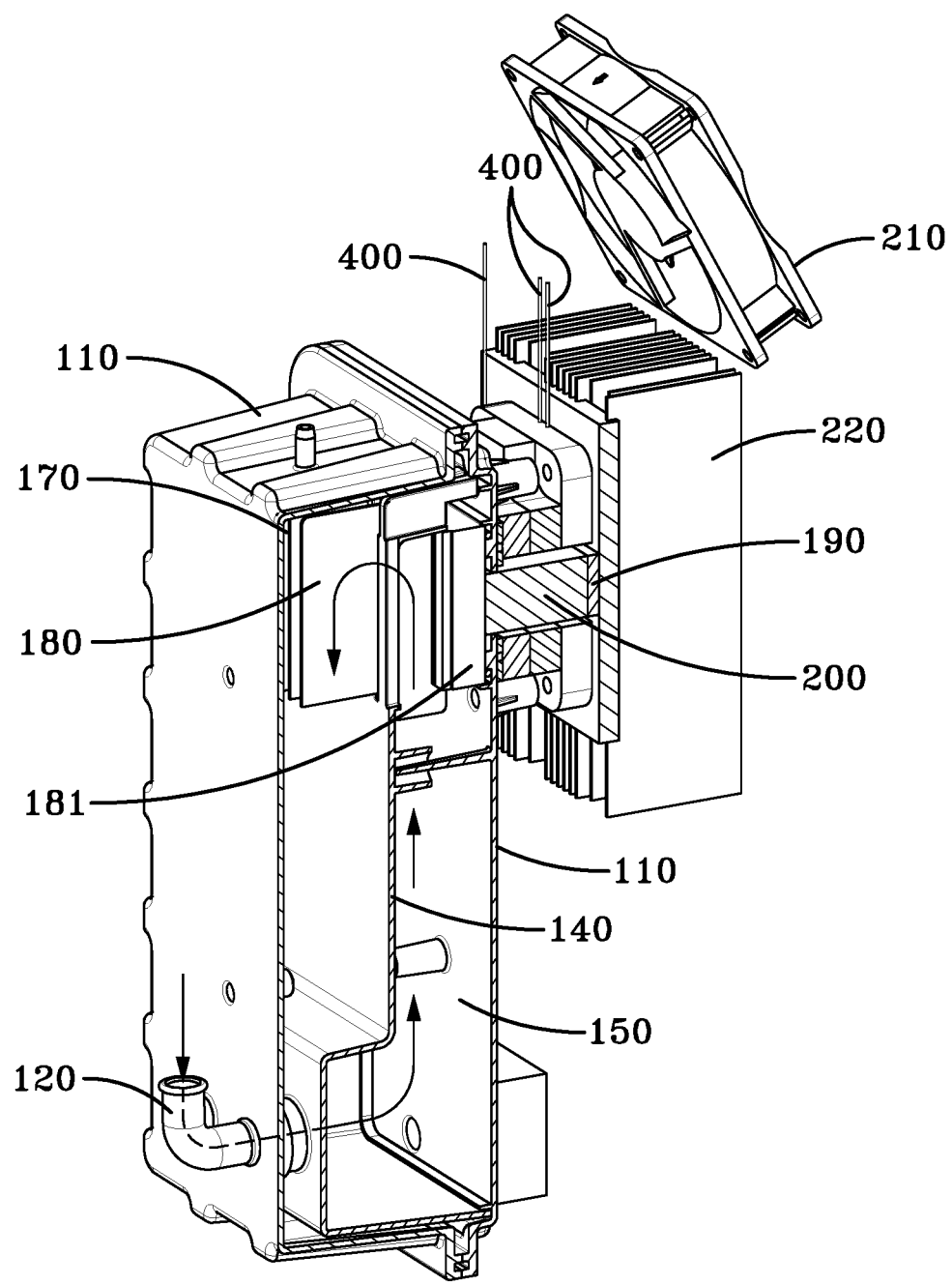
FIG. 6 shows a left side cross-sectioned view of the exemplary device shown in FIG. 1 wherein the insulation has not been shown about the tank and wherein the arrows shown in the figure illustrate how water may flow into and through the device.
Figure 7:
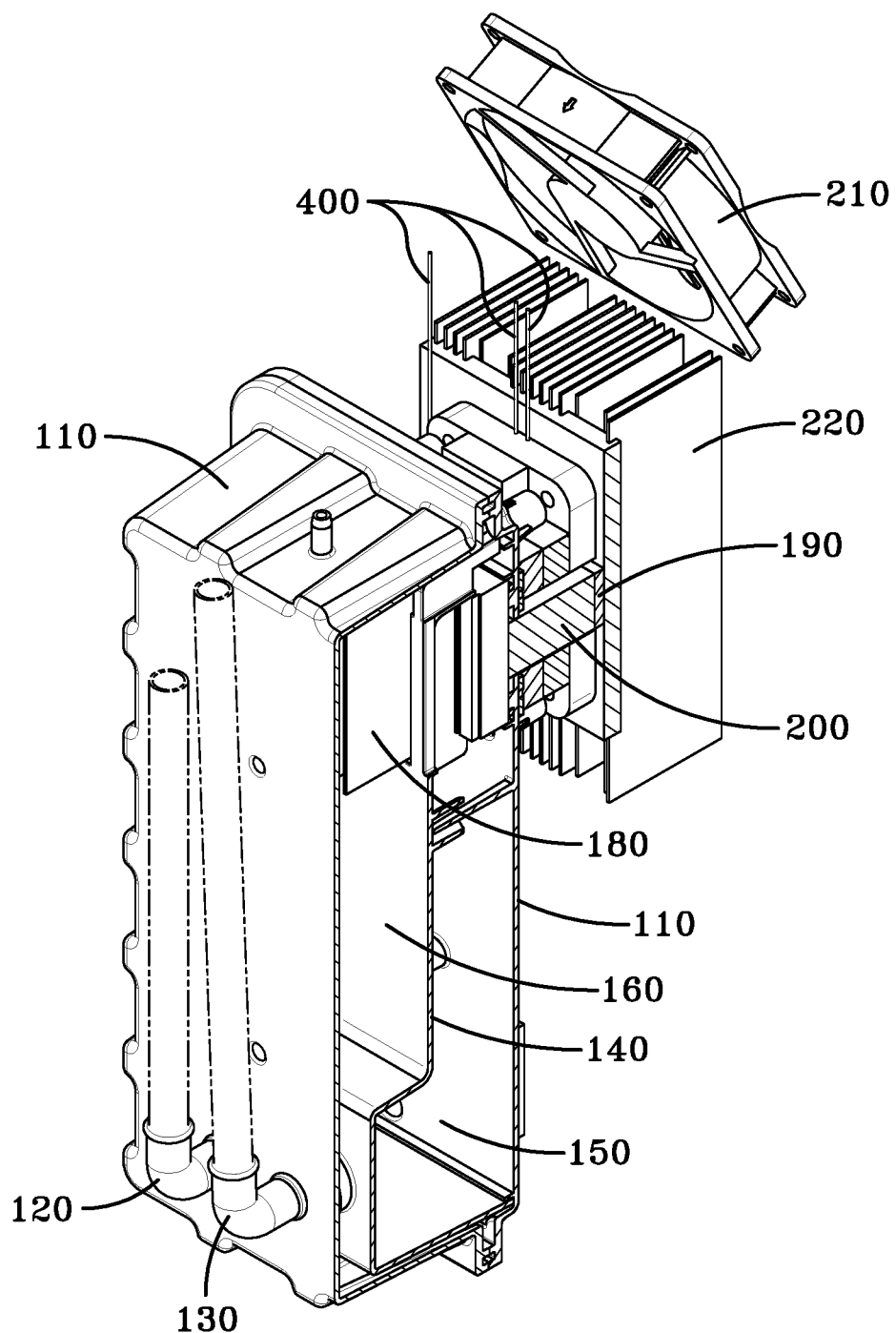
FIG. 7 shows a front perspective cross-sectioned view of the exemplary tank of FIG. 1 where again the insulation has not been shown.

As shown in FIG. 3, a spacer block 200 may be positioned between the thermoelectric chips 190 and the tank 110. The spacer block 200 conducts heat from the cooling fins 180 to the thermoelectric chips 190. In some exemplary embodiments, the spacer block 200 is made from aluminum. Other materials may be used in other exemplary embodiments. It is preferred that the material utilized for the spacer block 200 is rigid and thermally conductive. The spacer block 200 allows for thicker insulation 300 between the heat sink 210 and cooling fins 180 to reduce heat transfer back to the fins 180 from the heat sink 210. The thicker the spacer 200 the thicker the insulation 300. It should be appreciated that there is a balance to be struck between the thickness of the spacer block 200 and the insulation 300 thickness. If the spacer block 200 is made too thick, it will not move heat quickly enough. The thermoelectric chips 190 are ideally positioned outside of the tank body 110. In a preferred embodiment, and as is shown in FIGS. 3, 4, 5, 6, and 7, the cooling fins 180 are positioned at an upper part of the baffle 140 near the at least one opening(s) 170 where water may flow from the first area 150 to the second area 160. Preferably, as water is received by the tank 110 at the inlet 120, the water flows into the first area 150 and cooling of the water may commence due to exposure of the water in the first area 150 to at least part of the surface area of the cooling fins 180. As water is drawn from the tank 110 via the outlet 130, water may flow from the first area 150 to the second area 160 through the opening(s) 170. FIG. 6 uses arrows to illustrate the preferred flow of water from the inlet 120 into space 150 then through the cooling fins 180 and opening(s) 170 to space 160 where the water is selectively maintained until it is removed from the tank 110 via the outlet 130. When the cooling fins 180 are disposed at an upper portion of the baffle 140/tank 110 near the opening, the flowing water may be exposed to some of the surface area of the cooling fins 180 in the first area 150 and then also in the second area 160 after the water passes through the opening(s) 170 causing relatively quick chilling of the water.

The thermoelectric chips 190 that provide the cooling to the cooling fins 180 preferably have a first and second side. The first side is cool and is the side which is in connectivity (either direct or indirect) with the cooling fins 180. The second side of the thermoelectric chips 190 is hot and is ideally in connectivity with a heat sink 210. A fan 220 is preferably positioned next to the heat sink 210 such that it can draw air through and cool the heat sink 210, preventing the heat sink 210 from overheating. As shown in FIG. 1 and also in FIG. 2, insulation 300 may surround or substantially surround the tank 110 and may separate the tank 110 from the warm side of the thermoelectric chips 190, the heat sink 210, and the fan 220. The insulation 300 may define at least one opening which receives the spacer block 200 so that the thermoelectric chips 190, the heat sink 210, and the fan 220 may be separated from the tank 110 via the insulation 300 which will help keep water held in the tank cool.

Figure 8:
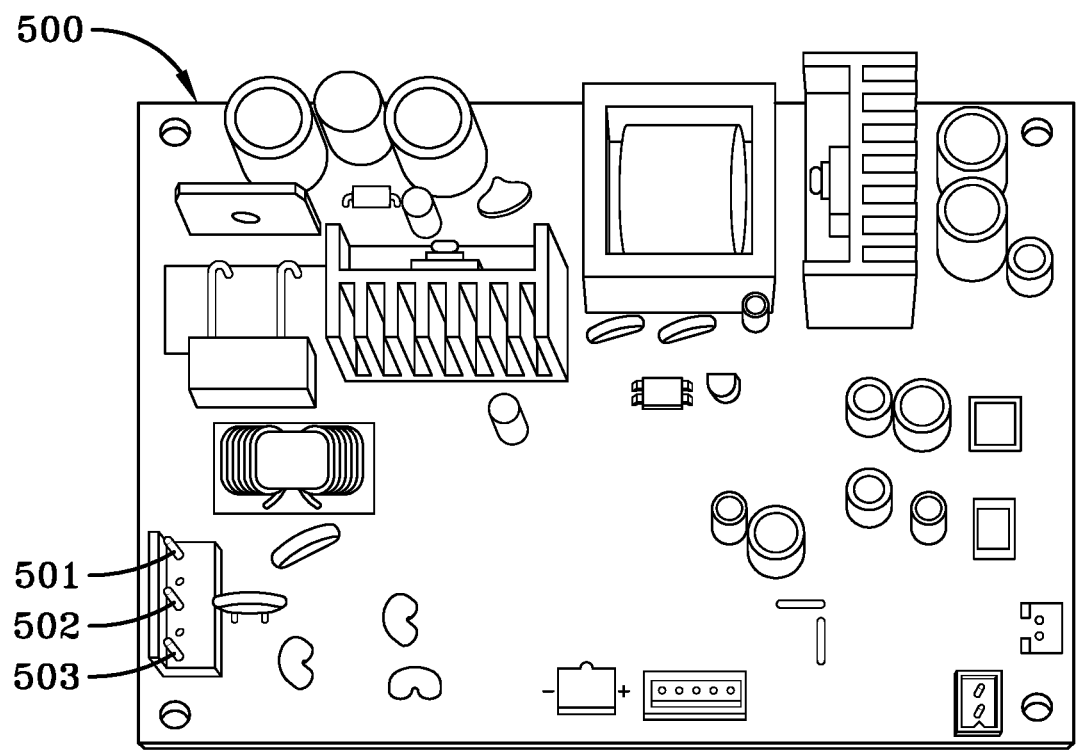
FIG. 8 shows a top plan view of an exemplary printed circuit board (PCB) comprising at least one power source capable of providing a high energy output and low energy output to the thermoelectric chips that provide cooling in preferred exemplary embodiments and which further comprises an exemplary electronic control.

The exemplary system and methods discussed above, may work in conjunction with a first and second power supply in order to increase efficiency of the cooling of water within the tank body 110. In such embodiments, a first power supply, is connected to the thermoelectric chips 190 and the fan 220 and is configured to provide a high energy output when more substantial cooling is needed (such as for example, when chilled water has been drawn from the tank 110 and the water volume in the tank 110 is replenished with warmer water received from the inlet 120). A second power supply, is connected to the thermoelectric chips 190 and the fan 220 and is configured to provide a lower energy output when a lesser degree of cooling is needed. In another, preferred, exemplary embodiment, a single printed circuit board ("PCB") 500 may comprise a single power supply that is capable of shifting between high power, low power, and no power outputs. Such an exemplary embodiment is shown in FIG. 8. As can be seen, the PCB 500 will preferably include a power connection comprising a line 501, neutral 502, and ground 503. In such an exemplary embodiment, the high power output may be utilized when more significant cooling of the water/fluid in the tank 110 is needed while the lower power output may be utilized when a relatively small amount of cooling of water/fluid in the tank 110 is needed. The power supply may be turned off when the ambient temperature of the water/fluid in the tank 110 gets too low and/or when the water in the tank is at a desired temperature and does not need additional cooling.

In an exemplary embodiment comprising a single power supply, a high power output may be approximately 50 Watts (12 Volts Direct Current to the Thermoelectric Chips 190 and Fan 220), while a low power output may be an output of approximately 4 Watts (3.1 Volts Direct Current to the Thermoelectric Chip 190 and 6 Volts of Direct Current to the fan 220). Note that the input power to the PCB 500 is likely greater than the power output by the PCB 500 due to inefficiency. In the exemplary embodiment just discussed, the high power input to the PCB 500 when a high power output is being generated would be approximately 75 Watts while the low power input would be 6.2 Watts. In some exemplary embodiments, the input power to the PCB 500 when a low power output is being generated is always less than 6.6 Watts. More details regarding exemplary power supplies that may be used in conjunction with a cooling device 100 are discussed in more detail below.

Figure 9:
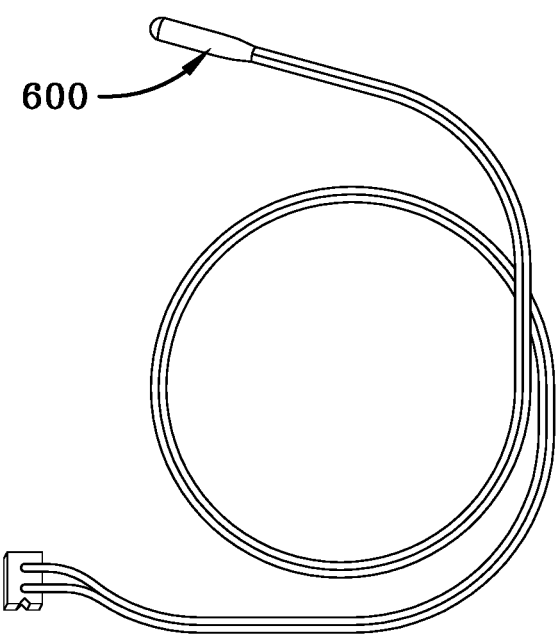
FIG. 9 shows a top plan view of an exemplary temperature sensor that may be utilized to obtain readings of the temperature in the tank.
Figure 10:
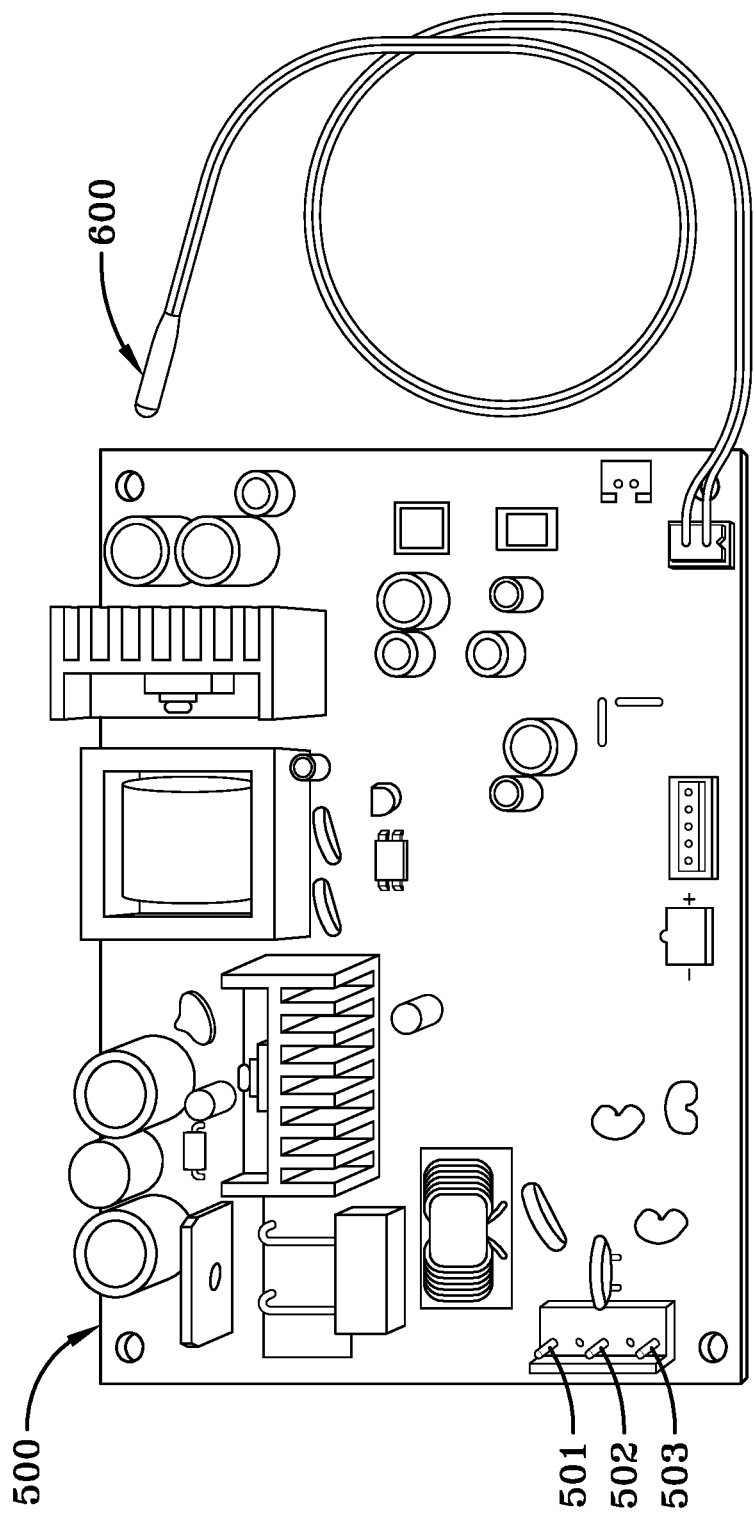
FIG. 10 shows a top plan view of the exemplary temperature sensor shown in FIG. 9 connected to the exemplary printed circuit board such that the sensor may send temperature reading information to the electronic control which in turn causes the at least one power source to send low or high energy output to the thermoelectric chips.
Figure 12:
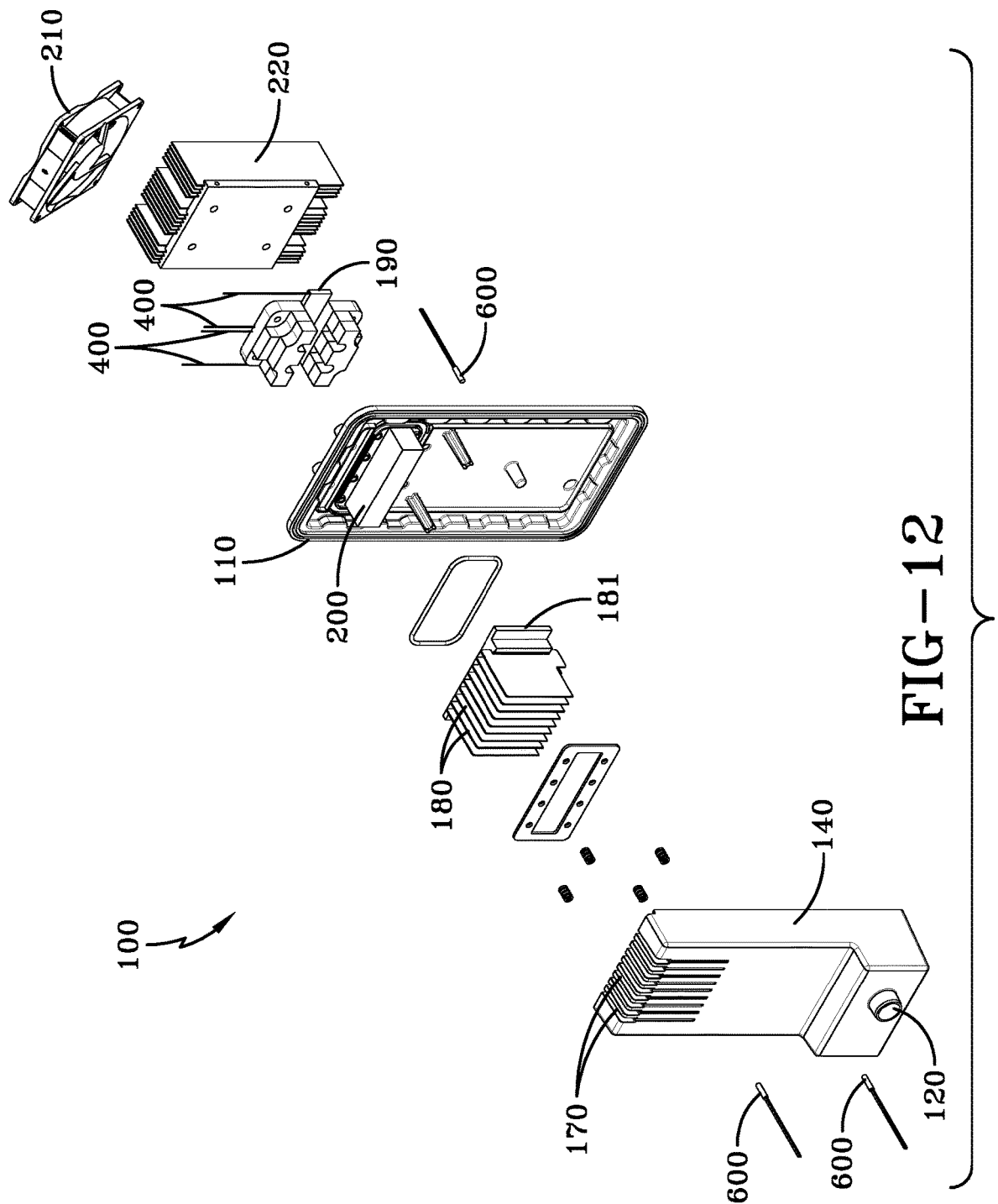
FIG. 12 is a top perspective exploded view of the exemplary cooling device shown in FIG. 11 wherein again part of the tank is not shown in order to more clearly show the other components of the device.

In the preferred exemplary embodiment, the system 100 additionally comprises an electronic control that is in connectivity with at least one temperature sensor 600 that measures (i.e. takes readings of) the water temperature within the tank 110. The PCB 500 shown in FIG. 8 comprises a power supply as well as an electronic control. FIG. 9 illustrates an exemplary temperature sensor 600 that may be utilized to obtain temperature measurements of the water in the tank. This may be enabled by positioning at least part of the temperature sensor inside of the tank 110. FIG. 10 illustrates the exemplary temperature sensor connected to the exemplary PCB 500. As shown in FIGS. 11 and 12, some exemplary systems may comprise more than one sensor 600 each of which would be in electronic connectivity directly or indirectly with the electronic control and at least one power supply. In such exemplary embodiments, a sensor 600 may be received by the first area 150 and another sensor 600 may be received by the second area 160.

In preferred embodiments, the electronic control compares the temperature measurement(s) received from the at least one sensor 600 with a predetermined temperature set point (i.e. the desired temperature of the chilled water in the tank) and sends a corresponding signal to at least one power supply. In exemplary embodiments comprising a first and second power supply, depending on the temperature difference between the water in the tank 110 and the set point, the control will shift between the first and second power supplies to provide enough power to the fan 220 and the thermoelectric chips 190 to pull the water temperature down to the cold water set point, maintain the water at the set point, turn off the power to prevent freeze-ups (which tend to occur when the ambient temperature drops to 65 degrees Fahrenheit or lower), etc. In such an embodiment, the second power source may be utilized to send power to the thermoelectric chips 190 and fan 220 when the temperature of the water in the tank 110 is not highly deviated from the set point (for example, when the water in the tank is only 3 or 4 degrees or less off of the set point temperature). But, if the temperature sensor 600 obtains a reading of the water and it is detected that the temperature of the water in the tank 110 is more highly deviated from the temperature set point (for example, if the temperature of the water is 7 or more degrees off of the set point temperature), the control can switch to the first power source such that it is then supplying energy to the chips 190 and fan 220.

In exemplary embodiments comprising a single power supply that has the capability of shifting between high power, low power, and off (no power being supplied), the electronic control is preferably capable of obtaining temperature readings from the temperature sensor 600 and sending signals to the power supply that tell the power supply whether it should provide high power, low power, or no power to the chips 190 and/or fan 220. In some embodiments, the power source only supplies power to the chips 190 and fan 220 when the water is at least a certain temperature above the set point.

In some embodiments the set point may be provided to the electronic control and modified by a system user. In other words, the control may be capable of receiving a set point from a system user and cause the water in the tank 110 to be maintained at the provided set point by instructing the first and/or second power source to send power to the chips 190 and fan 220. In some embodiments however, the control maintains a set point temperature of water in the tank 110 that is not modified by system users.

Power supplies run most efficiently when they operate at outputs close to the maximum output available. Efficiencies of 75% to 90% are easily achievable. When power supplies operate at low output relative to the maximum output of the power supply, the efficiency can drop to lower than 50%. In the preferred exemplary embodiment of the currently disclosed system 100, the energy required to maintain chilled water within the tank 110 and the set point is less than 4.5 Watts to the fan and the thermoelectric chips. However, when a new volume of warm water is received into the first area 150 of the tank 110 from the inlet 120 and more substantial cooling is needed to pull down the temperature of the water to the set point, the maximum energy needed is closer to 60 Watts. Using a single power source to supply energy for both of these functions would be inefficient and would mean that the power supplied to the electronic control and thermoelectric chips 190 would exceed the EPA Energy threshold. In dual power supply systems, the first power source preferably has a relatively low maximum energy output while the second power source has a relatively high maximum energy. By having dual power supplies, one which is activated to provide a lower energy output for maintaining the set point temperature and one which is activated to provide a higher energy output for pulling down the temperature of the water in the tank 110 for example when new water has been provided to the first area 150 via the inlet 120, the EPA energy threshold can be achieved. However, in some exemplary embodiments this can also be achieved by using a single PCB power supply 500 that has the capability of shifting between a high energy output, a low energy output, and a no energy output feature.

Exemplary power supplies that may be utilized are switching power supplies and/or pulse width modulated supplies. Preferably, the power supplies are in connectivity with an electronic control and are even built on a single printed circuit board (this is preferably the case even in exemplary embodiments comprising dual power supplies). In water cooler systems comprising the present cooling device 100, the circuit board comprising the dual power supplies and/or single power supply and the electronic control would ideally be positioned within the cabinet of the water cooler. There is no specific location within the cabinet where the circuit board must be placed there just needs to be wires that connect the board to the tank 110 (and more specifically to the thermoelectric chips 190 and fan 220). While FIGS. 1 through 7 do not show the power supplies that may be included with or connect to the system 100, the Figures (see for example FIGS. 4 and 6) do illustrate the wire leads 400 that may be utilized to connect the thermoelectric chips 190 and the fan 220 (see FIG. 2) to the dual power supplies.

An exemplary embodiment comprises a method of chilling water using an exemplary cooling device as is shown in FIGS. 1 through 7 and 11 through 12 and/or as has been described elsewhere herein. Such a method may comprise one or more or all of the steps of: receiving a volume of fluid within a first area of a tank via an inlet, measuring the temperature of the received fluid, detecting that the temperature of said fluid is above a desired set point, causing power to be sent to two thermoelectric chips the cool sides of which are in thermal connectivity with a plurality of cooling fins that are attached to the tank and which extend into the first area such that the fins come into physical contact with the water in the first area thereby causing chilling of the water. The method may further comprise one or more or all of the steps of: causing the fluid to flow into a second area of the tank via at least one opening that extends between the first and second areas, exposing the fluid to the plurality of cooling fins as it flows through the at least one opening as well as within the second area causing further cooling of the fluid, and removing the chilled fluid from the second area of the tank via an outlet.

Any embodiment of the disclosed system and method may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A device for chilling liquid, the device comprising:
   a tank for receiving and selectively maintaining a volume of liquid within its interior;
   an inlet for receiving the volume of liquid into the tank;
   an outlet which permits for the liquid to be removed from the tank;
   a baffle disposed within the tank such that a first side of the baffle assists in defining a first area within the tank interior for receiving the volume of liquid from the inlet and a second side of the baffle assists in defining a second area within the tank interior for holding at least some of the liquid before it is removed from the tank through the outlet;
   at least one opening defined by at least part of the baffle and part of the interior of the tank body wherein said opening extends between the first area and the second area and permits for liquid to travel from the first area to the second area;
   a plurality of cooling fins connected to the tank wherein each cooling fin extends into the interior of the tank and protrudes through the first side of the baffle to the second side of the baffle such that some of the fin extends into the first area of the tank interior and some of the fin extends into the second area of the tank interior; and
   at least two thermoelectric chips in thermal connectivity with the cooling fins, such that at least one first thermoelectric chip is in connectivity with at least some of the cooling fins and at least one second thermoelectric chip is in connectivity with at least some of the cooling fins.

2. The device of claim 1 wherein the at least one first thermoelectric chip and the at least one second thermoelectric chip each have a width and a height and the first and second thermoelectric chips are positioned next to each other horizontally such that they collectively have a width that is greater than the height of the chips and the width of the thermoelectric chips is placed horizontal to the direction the liquid would flow from the first area to the second area.

3. The device of claim 2 further comprising a thermally conductive spacer block that thermally connects the thermoelectric chips to the cooling fins.

4. The device of claim 1 further comprising:
   a temperature sensor disposed within the tank such that it may take a temperature reading of the liquid selectively stored in said tank;
   an electronic control in connectivity with said temperature sensor wherein said control obtains temperature readings from the temperature sensor and generates signals based on said readings; and
   at least one power supply in connectivity with the electronic control wherein said at least one power supply receives the signals generated by the control and is adapted to switch between a high power output and a low power output based on the signals.

5. The device of claim 1 wherein the at least one opening is a plurality of openings such that there is an opening defined by the baffle for each one of the cooling fins and each cooling fin is received by one of the openings such that the liquid may travel from the first area to the second area via the plurality of openings gaining exposure to surface area of the cooling fins as it flows through said openings.

6. The device of claim 1 wherein the cooling fins are connected to the tank via a plate which is integral with the fins wherein said plate extends from the interior of the tank to the exterior of the tank.

7. The device of claim 1 further comprising a layer of insulation having an inner surface and an outer surface wherein said insulation surrounds the exterior of the tank and defines an opening such that the at least one thermoelectric chip is positioned at the outer surface of the insulation and the tank is positioned at the inner surface of the insulation.

8. The device of claim 1 wherein the at least one thermoelectric chip comprises more than two thermoelectric chips.

9. The device of claim 8 wherein the more than two thermoelectric chips are positioned next to each other such that they collectively have a width that is vertical to the direction liquid would flow within the tank as it would flow from the first area to the second area.

10. A device for chilling liquid, the device comprising:
    a tank for receiving and selectively maintaining a volume of liquid within its interior;
    an inlet for receiving the volume of liquid into the tank;
    an outlet which permits for the liquid to be removed from the tank;
    a baffle disposed within the tank such that a first side of the baffle assists in defining a first area within the tank wherein said first area receives the liquid from the inlet and a second side of the baffle assists in defining a second area within the tank wherein said second area provides the liquid to the outlet;
    a plurality of openings defined by the baffle wherein each of said openings extends between the first area and the second area and permits for the liquid to travel from the first area to the second area;

a plurality of cooling fins wherein each cooling fin is connected to the tank and extends into the interior of the tank such that each fin is received by and protrudes through one of the openings such that some of each cooling fin extends into the first area of the tank interior and some of each fin extends into the second area of the tank interior; and two thermoelectric chips in thermal connectivity with the cooling fins, wherein the two thermoelectric chips each has a width and a height and the chips are positioned next to each other such that the collective width of the two chips is greater than the height of the chips and the chips are positioned relative to the tank such that the collective width is horizontal to the direction the liquid would flow as it travels from the first area to the second area.

11. The device of claim 10 further comprising a temperature sensor disposed within the tank such that it may obtain temperature readings of the liquid selectively maintained in the tank.

12. The device of claim 11 further comprising:
at least one power source in electronic connectivity with the thermoelectric chips; and
an electronic control that is in electronic connectivity with the temperature sensor as well as the at least one power source wherein the electronic control receives temperature reading information from the temperature sensor and generates signals based on said reading information and sends said signals to the at least one power source causing it to supply power to the thermoelectric chips.

13. The device of claim 12 wherein the at least one power source is capable of supplying a high power output to the thermoelectric chips as well as a low power output to the thermoelectric chips.

14. The device of claim 13 wherein the at least one power source comprises a first power source and a second power source and the first power source supplies the high power output to the thermoelectric chips and the second power source supplies the low power output to the thermoelectric chips upon receipt of signals received from the control.

15. The device of claim 13 wherein the high power output is approximately 50 Watts.

16. The device of claim 13 wherein the low power output is approximately 4 Watts.

17. A device for chilling liquid, the device comprising:
a tank for receiving and selectively maintaining a volume of liquid within its interior;
an inlet for receiving the volume of liquid into the tank;
an outlet which permits for the liquid to be removed from the tank;
a baffle disposed within the tank such that a first side of the baffle assists in defining a first area within the tank wherein said first area receives the liquid from the inlet and a second side of the baffle assists in defining a second area within the tank wherein said second area provides the liquid to the outlet;
at least one opening defined by the baffle wherein each at least one opening extends between the first area and the second area and permits for liquid to travel from the first area to the second area;
a plurality of cooling fins connected to the tank that extend into the interior of the tank and protrude through the baffle such that some of each fin extends into the first area of the tank interior and some of each fin extends into the second area of the tank interior; and
two thermoelectric chips in thermal connectivity with the cooling fins, wherein the plurality of cooling fins protrudes through the baffle through the at least one opening defined by the baffle.

18. The device of claim 17 further comprising a thermally conductive spacer block which thermally connects the cooling fins to the thermoelectric chips.

19. The device of claim 18 wherein the two thermoelectric chips each have a width and a height and the chips are positioned next to each other such that the collective width of the two chips is greater than the height of the chips and the chips are positioned relative to the tank such that the collective width is horizontal to the direction the liquid would flow as it travels from the first area to the second area.

* * * * *